United States Patent
Ogihara

(10) Patent No.: US 8,519,529 B2
(45) Date of Patent: Aug. 27, 2013

(54) SEMICONDUCTOR PACKAGE WITH LID BONDED ON WIRING BOARD AND METHOD OF MANUFACTURING THE SAME

(75) Inventor: Chiho Ogihara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 208 days.

(21) Appl. No.: 13/004,444

(22) Filed: Jan. 11, 2011

(65) Prior Publication Data
US 2011/0169155 A1 Jul. 14, 2011

(30) Foreign Application Priority Data
Jan. 12, 2010 (JP) .................................. 2010-003701

(51) Int. Cl.
*H01L 23/12* (2006.01)

(52) U.S. Cl.
USPC ............................ 257/704; 257/707; 257/787

(58) Field of Classification Search
USPC .................. 257/787, 704, 706, 707, 782, 783
See application file for complete search history.

(56) References Cited

U.S. PATENT DOCUMENTS

| | | | | |
|---|---|---|---|---|
| 4,706,105 A | * | 11/1987 | Masuda et al. | 257/695 |
| 5,416,358 A | * | 5/1995 | Ochi et al. | 257/666 |
| 5,653,020 A | * | 8/1997 | Romano' et al. | 29/856 |
| 7,144,245 B2 | * | 12/2006 | Bolken et al. | 425/542 |
| 2008/0036069 A1 | * | 2/2008 | Ito et al. | 257/690 |
| 2008/0217753 A1 | * | 9/2008 | Otani | 257/690 |
| 2008/0258164 A1 | * | 10/2008 | Masui et al. | 257/98 |
| 2009/0162957 A1 | * | 6/2009 | Joung | 438/27 |

FOREIGN PATENT DOCUMENTS

| | | |
|---|---|---|
| JP | 8-17853 | 1/1996 |
| JP | 2000-311960 | 11/2000 |
| JP | 2001-110926 | 4/2001 |
| JP | 2001-156086 | 6/2001 |

OTHER PUBLICATIONS

Japanese Official Action—2010-003701—Jan. 17, 2013.

* cited by examiner

*Primary Examiner* — S. V. Clark
(74) *Attorney, Agent, or Firm* — Young & Thompson

(57) ABSTRACT

A semiconductor apparatus includes: a wiring board; a lid; and gap filling resin. A semiconductor chip is mounted on the wiring board. The lid includes inlet portions for injecting resin. The semiconductor chip is covered with the lid on the wiring board. The gap filling resin bonds the wiring board and the lid inside the lid.

19 Claims, 8 Drawing Sheets

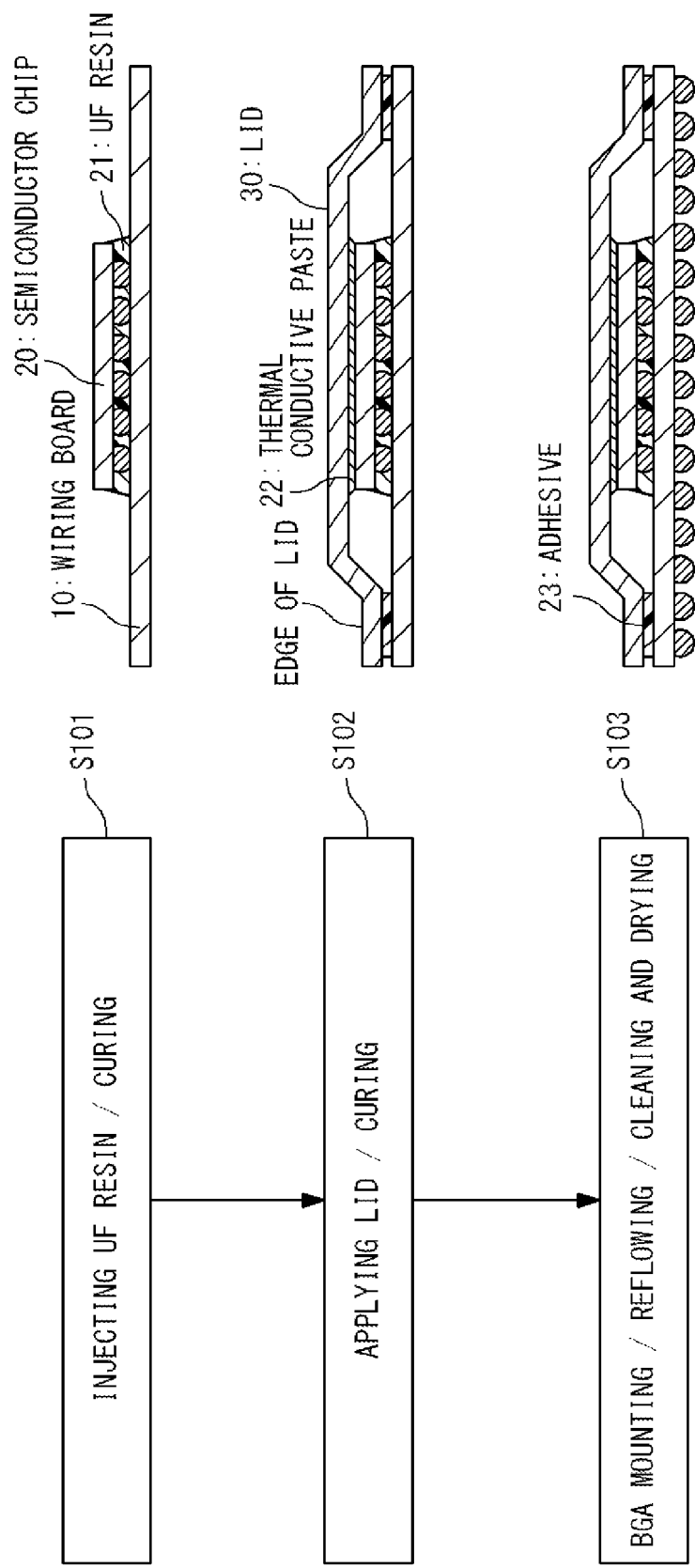

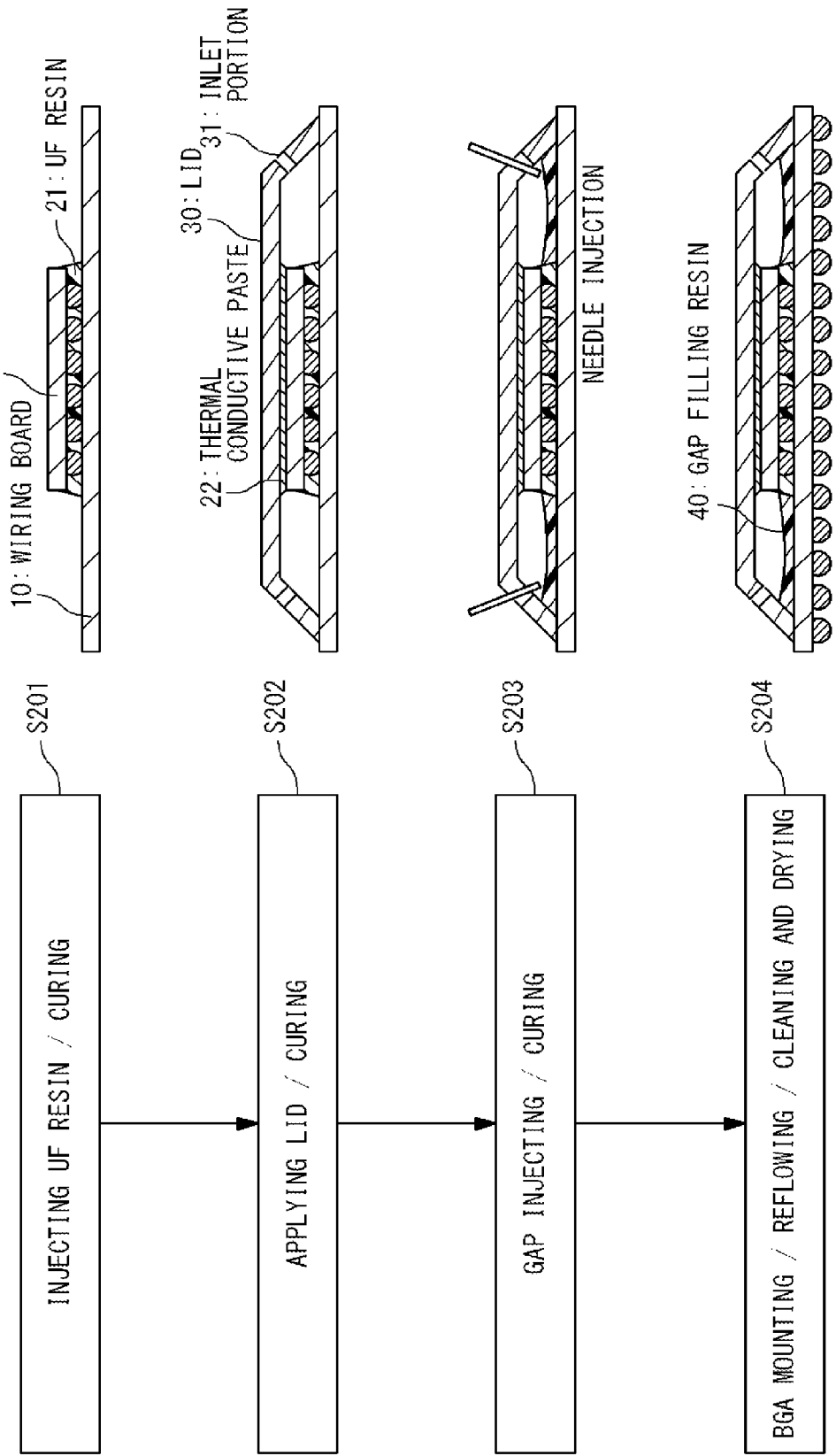

US 8,519,529 B2

SEMICONDUCTOR PACKAGE WITH LID BONDED ON WIRING BOARD AND METHOD OF MANUFACTURING THE SAME

INCORPORATION BY REFERENCE

This application is based upon and claims the benefit of priority from Japanese patent application No. 2010-003701 filed on Jan. 12, 2010, the disclosure of which is incorporated herein in its entirety by reference.

BACKGROUND OF THE INVENTION

1. Field of the Invention

The present invention relates to a semiconductor apparatus and a method of the same. More particularly, the present invention relates to a semiconductor apparatus with a lid bonded on a wiring board and a method of manufacturing the same.

2. Description of Related Art

In the FCBGA (Flip Chip Ball Grid Array) semiconductor package, it is known that by covering a semiconductor chip mounted on a wiring board with a cover so-called "lid", the semiconductor chip has contact with the lid through thermal conductive paste, thereby enabling the lid to function as a heat sink.

FIG. 1 is a sectional view showing a semiconductor package disclosed in Japanese Patent Publication JP-P 2000-311960A. In this semiconductor package, a semiconductor chip 120 is covered with a cover so-called "lid" 130. The lid 130 is bonded to the wiring board 110 only at an edge portion of the lid 130 (edge of the lid 130; outer frame portion having contact with the wiring board). To make the lid 130 function as a heat sink, thermal conductive past 122 is applied to a back surface of the semiconductor chip 120 after underfill (UF) resin 121 is thermally-cured. The lid 130 is bonded on the wiring board 110 as described below. First, an adhesive (lid adhesive resin) 123 is applied to the wiring board 110 in the form of a line. Next, the lid 130 is bonded at the edge of the lid 130 on a portion where the adhesive 123 is applied. Then, the adhesive 123 is thermally-cured.

In conjunction with the above description, Japanese Patent Publication No. JP-P 2001-110926A discloses a flip chip package. The object is to improve flatness of a wiring board and a lid by reducing stress applied to a semiconductor chip and bumps formed on the semiconductor chip.

The inventor has now discovered the following facts. In the related art, to bond the lid 130 and the wiring board 110, the edge portion of the lid 130 is used. Based on the inventor's consideration, to obtain superior adhesive strength between the lid 130 and the wiring board 110, it is required that the size of the edge portion of the lid 30 is greater than a certain level size. This becomes the barrier against miniaturizing of a semiconductor package.

SUMMARY

The present invention seeks to solve one or more of the above problems, or to improve upon those problems at least in part.

In one embodiment, a semiconductor apparatus includes: a wiring board, a semiconductor chip being mounted on the wiring board; a lid configured to include inlet portions for injecting resin, the semiconductor chip being covered with the lid on the wiring board; and gap filling resin configured to bond the wiring board and the lid inside the lid.

In another embodiment, a method of manufacturing a semiconductor apparatus, includes: arranging a lid on a wiring board mounting a semiconductor chip, the lid including inlet portions for injecting resin, the semiconductor chip on the wiring board being covered with the lid; inserting a dispenser into each of the inlet portions; injecting gap filling resin into an inside of the lid from the each inlet portion by using the dispenser; and thermally-curing the gap filling resin.

According to the present invention, by injecting the gap filling resin for bonding and fixing the lid and the wiring board inside the lid, the lid and the wiring board inside the lid can be bonded and fixed.

According to the present invention, the semiconductor can be miniaturized while the adhesive strength between the lid and the wiring board is maintained.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a view showing a flow of a manufacturing process according to a comparison example;

FIG. 5 is a view showing a flow of a manufacturing process according to the embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 2:
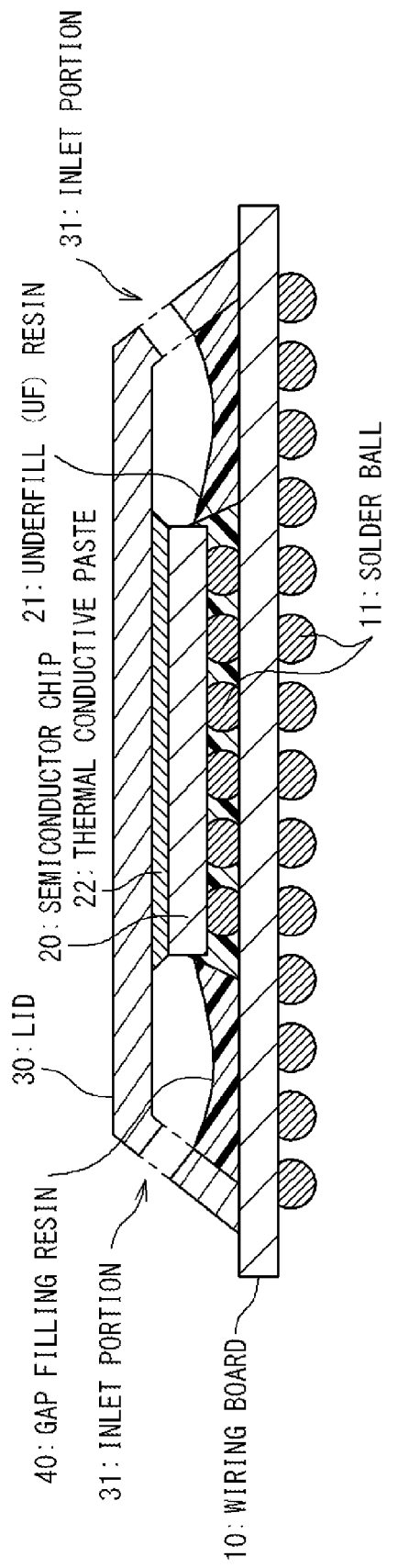
FIG. 2 is a sectional view showing a configuration example of a semiconductor apparatus according to an embodiment of the present invention.

Embodiments of a semiconductor apparatus according to the present invention will be described below with reference to the attached drawings. FIG. 2 is a sectional view showing a configuration example of a semiconductor apparatus according to an embodiment of the present invention. As shown in FIG. 2, a semiconductor apparatus according to the present embodiment includes: a wiring board 10, a semiconductor chip 20 and a lid 30.

Here, the FCBGA (Flip Chip Ball Grid Array) semiconductor package is assumed as an example of the semiconductor apparatus according to the present embodiment. However, the semiconductor package according to the present embodiment is not limited to the FCBGA semiconductor package and it may be possible to employ the present embodiment to a similar semiconductor package. In addition, the semiconductor apparatus according to the present embodiment is not limited to the semiconductor package itself and it may be possible to be an electron device or other devices including the semiconductor package as mentioned above.

The wiring board 10 is a multilayer wiring board for mounting the semiconductor chip 20. Here, the wiring board 10 is a package substrate.

The semiconductor chip 20 is mounted on the wiring board 10. Here, the semiconductor chip 20 is electrically connected to the wiring board 10 through solder balls (bumps) 11. The solder balls 11 are encapsulated by underfill (UF) resin 21. Thermal conductive paste 22 is applied to a back surface (upper surface in FIG. 2) of the semiconductor chip 20. Here, the solder balls 11, the underfill (UF) resin 21, the thermal conductive paste 22 are not indispensable because they are not the feature of the present invention. For example, the solder balls 11 may be replaced by an adhesive including metal such as gold, silver and the like or silver paste. The thermal conductive paste 22 may be replaced by a thermal conductive sheet. The lid 30 is bonded to the wiring board 10 such that the semiconductor chip 20 is covered with the lid 30. The lid 30 is provided with inlet portions 31. Each inlet portion 31 is a hole penetrating through the lid 30. In the example of FIG. 2, the inlet portions 31 are formed in a gradient portion (side wall) of the lid 30.

Figure 3A:
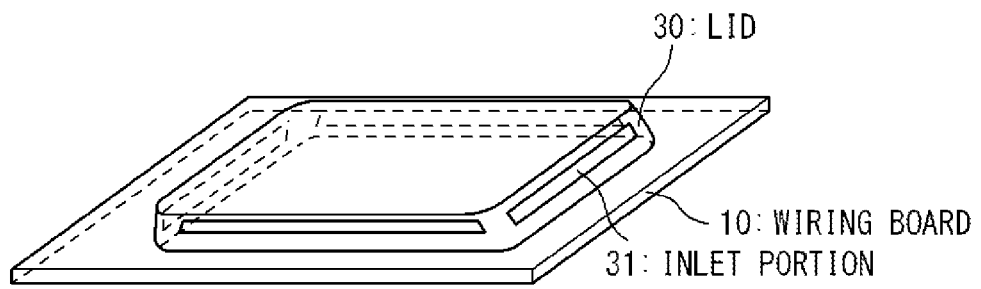
FIGS. 3A to 3C are perspective views showing the first to the third examples of arrangements of inlet portions in a lid according to the embodiment of the present invention.
Figure 3B:
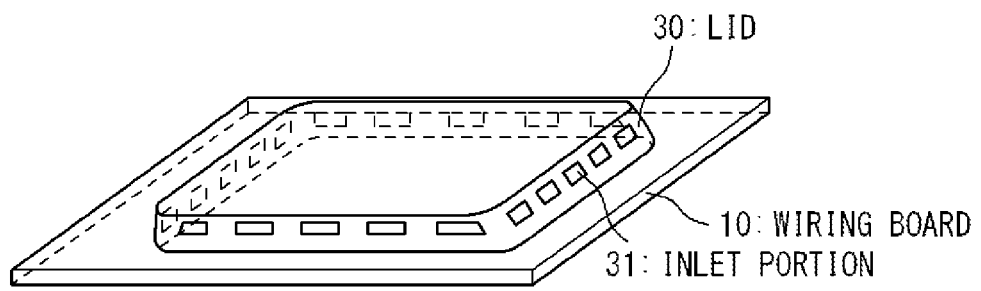
Figure 3C:
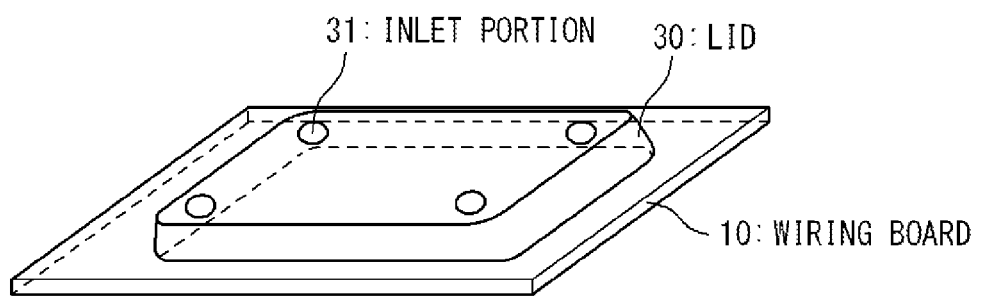

In this case, the inlet portions 31 may have various examples. FIGS. 3A to 3C are perspective views showing the first to the third examples of arrangements of inlet portions in a lid according to the embodiment of the present invention as shown in FIG. 3A, the inlet portions 31 may be thin and long openings along the gradient portion (side wall) of the lid 30. As shown in FIG. 3B, the inlet portions 31 may be small openings arranged at regular intervals along the gradient portion (side wall) of the lid 30. In addition, the inlet portions 31 may be provided on the gradient portion (side wall) of the lid 30, or the inlet portions 31 may be provided on a top board portion (top wall) of the lid 30 as shown in FIG. 3C. Further, the inlet portions 31 may be provided not only on the side wall of the lid 30 as shown in FIG. 3A or 3B, but also on the top wall of the lid 30 as shown in FIG. 3C. In this case, the configuration is a combination of the configuration of FIG. 3A or 3B and the configuration of FIG. 3C.

From the inlet portions 31, gap filling resin (Gap resin) 40 is injected into a gap portion (area where nothing is arranged) inside the lid 30. The inside of the lid 30 is an area which is covered with lid 30 and in which the semiconductor chip 20 is included.

The example of FIG. 2, the gap filling resin 40 fills the inside of the lid 30 at the level of the inlet portions 31 or lower. The gap filling resin 40 may fill the inside of the lid 30 at the level of the top board portion.

Further, as shown in FIG. 2, the gap filling resin 40 may be provided so as to have contact with the underfill (UF) resin 21. In this case, since the surface of the wiring board 10 surrounded by the lid 30 is covered with the underfill (UF) resin 21 and the gap filling resin 40, the warpage of the wiring board 10 is suppressed. The effect is especially remarkable when material of the gap filling resin 40 is the same as that of the underfill (UF) resin 21.

In addition, now shown here, the gap filling resin may be provided so as not have contact with the semiconductor chip 20 nor the underfill (UF) resin 21 and so as to have contact with only the wiring board 10 and the gradient portion of the lid 30. In this case, as for a method of injecting the gap filling resin 40, following methods are considered. First one is a method of injecting intensively a small amount of the gap filling resin 40 between the wiring board 10 and the gradient portions of the lid 30. The second one is a method of preparing a step, a protrusion or a partition between the underfill (UF) resin 21 and the edge portion of the lid 30 and injecting the gap filling resin 40 between the edge of the lid 30 and the step, the protrusion or the partition. Here, the step, the protrusion or the partition may be formed by modifying the wiring board 10 or the lid 30, or may be formed of resin, solder or the like. However, the present invention is not limited to these examples.

The effect of the gap filling resin 40 which does not have contact with the underfill (UF) resin 21 will be described below. There is a case that the fillet (side surface) geometry of the underfill (UF) resin 21, especially the gradient of the side surface is optimized with regard to the relation to the warpage of the wiring board. In this case, if the gap filling resin 40 has contact with the fillet of the underfill (UF) resin 21, the stress distribution is varied in an unintended direction, thereby reducing the warpage suppression effect for the wiring board 10 generated by the underfill (UF) resin 21. However, by not having contact between the gap filling resin 40 and the underfill (UF) resin 21, the effect can be obtained in which the lid 30 is bonded to the wiring board 10 without exerting a negative impact on the warpage suppression effect for the wiring board 10 generated by the underfill (UF) resin 21.

Here, it is assumed that the injection of the gap filling resin 40 at the inlet portions 31 is performed by using a dispenser (not shown) such as a jet dispenser, a needle dispenser, or the like. It is preferable that the tip of the dispenser is a circular form.

Incidentally, when the gap filling resin 40 is thermally-cured, since it is enough to thermally-cure portions where the gap filling resin 40 has contact with the wiring board 10 and the lid 30, only the gradient portion (side wall) of the lid 30 may be heated such that the semiconductor chip 20 is not heated. In addition, the semiconductor chip 20 may be protected and/or isolated by being coated with coating thermal insulating material and the like so as not to receive an adverse effect of thermally-curing of the gap filling resin 40.

Next, a manufacturing process according to the embodiment of the present embodiment will be described below with comparing to that of a comparison example. FIGS. 4 and 5 are views showing flows of manufacturing processes according to the comparison example and the embodiment of the present invention.

It is assumed that these manufacturing processes are performed by a FCBGA semiconductor package manufacturing apparatus. Here, since steps until the underfill (UF) resin is injected are common in both processes and there is no difference between the comparison example and the present embodiment, the description is not omitted.

FIG. 4 shows the flow of the manufacturing process of the comparison example.

(1) Step S101

The underfill (UF) resin 21 is injected under the semiconductor chip 20. Then, the underfill (UF) resin 21 is thermally-cured.

(2) Step S102

After the thermal conductive paste is applied to the back surface of the semiconductor chip 20, the adhesive (lid adhesive resin) 23 is applied to the wiring board 10 in the form of a line. Next, the lid 30 is bonded at the edge of the lid 30 on a portion where the adhesive 23 is applied to the wiring board 10. Then, the thermal conductive paste 22 and the adhesive 23 are thermally-cured.

(3) Step S103

Next, the solder balls 11 are mounted on electrodes (not shown here) of the back surface (surface opposite to the surface where the semiconductor chip 20 is mounted of the wiring board 10) of the formed FCBGA semiconductor package. After that, by heating (reflowing) the semiconductor package to melt solder balls 11, the solder balls 11 are connected to the electrodes (not shown). Then, cleaning and drying are carried out.

FIG. 5 shows the flow of the manufacturing process of the present embodiment.

(1) Step S201

The underfill (UF) resin 21 is injected under the semiconductor chip 20. Then, the underfill (UF) resin 21 is thermally-cured. This step is the same as the step S101 shown in FIG. 4.

(2) Step S202

After the underfill (UF) resin 21 is thermally-cured, the thermal conductive paste 22 is applied to the back surface of the semiconductor chip 20. Then, the semiconductor chip 20 is covered with the lid 30 such that the lid 30 is arranged on the wiring board 10. After that, the thermal conductive paste 22 is thermally-cured. Here, it is assumed that the inlet portions 31 for injecting resin are previously prepared in the lid 30 for the FCBGA.

(3) Step S203

After the lid 30 is arranged on the wiring board 10, the needle dispenser is inserted into each inlet portion 31 provided in the lid 30. By using the needle dispenser, the gap filling resin 40 is injected into the gap portion inside the lid 30 from the inlet portions 31. Then, the gap filling resin 40 is thermally-cured. Here, the material of the gap filling resin 40 may be the same as the lid adhesive resin which is the same as the material of the adhesive 23. The material of the gap filling resin 40 may be the same as that of the underfill (UF) resin 21.

(4) Step S204

After the gap filling resin 40 is thermally-cured, the solder balls 11 are mounted on electrodes (not shown here) of the back surface (surface opposite to the surface where the semiconductor chip 20 is mounted of the wiring board 10) of the formed FCBGA semiconductor package. After that, by heating (reflowing) the semiconductor package to melt solder balls 11, the solder balls 11 are connected to the electrodes (not shown). Then, cleaning and drying are carried out. This step is the same as the step S103 shown in FIG. 4.

In the above step S202, when the lid 30 is arranged on the wiring board 10, the lid 30 is tentatively fixed by the thermal conductive paste 22 to some degree. In addition, it is preferable that the lid cannot move temporally on the wiring board 10.

At that time, to temporally fix the edge portion of the lid 30, as the same as the FCBGA shown in FIG. 4, it may be possible that the adhesive (lid adhesive resin) 23 is applied to the wiring board 10 in the form of a line, the wiring board 10 and the edge of the lid 30 are bonded and the adhesive 23 is thermally-cured. Here, it is sufficient that the adhesive 23 has the amount in which the lid 30 can be temporally fixed (tentatively fixed) so as not to move on the wiring board 10 until the wiring board 10 and the lid 30 are completely bonded by the gap filling resin 40. That is, it is not necessary that the adhesive 23 has the amount in which the lid 30 and the wiring board 10 can be completely bonded. Therefore, in this case, the area occupied by the edge portion of the lid 30 and the adhesive 23 of the present embodiment can be smaller than the area occupied by the edge of the lid 30 and the adhesive 23 of the FCBGA shown in FIG. 4.

Further, as for the method of fixing the lid 30, the method is considered in which a caving portion, a protrusion portion or a step portion for temporally fixing the edge portion of the lid 30 is formed on the wiring board 10.

Figure 6A:
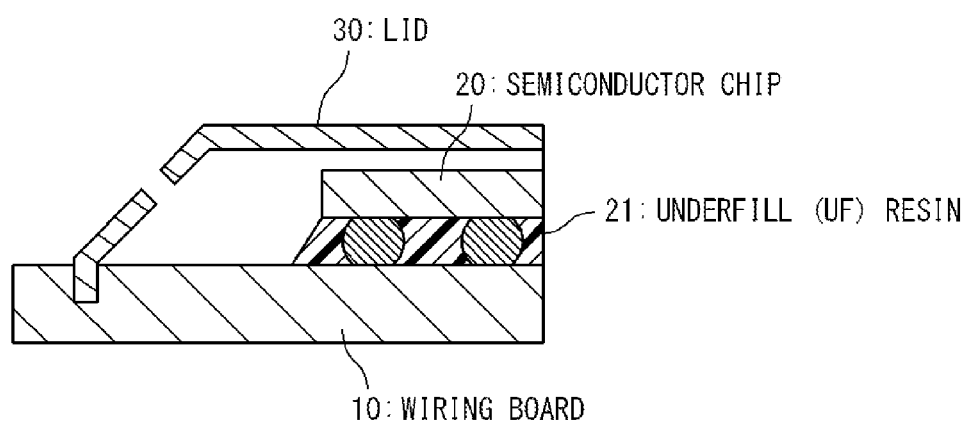
FIGS. 6A to 6D are sectional views showing the first to the fourth examples of methods of fixing the lid according to the embodiment of the present invention.
Figure 6B:
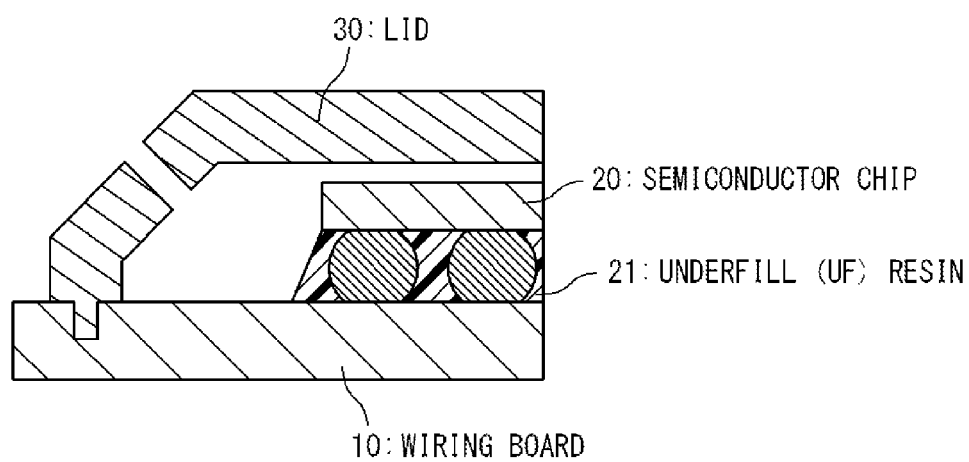
Figure 6C:
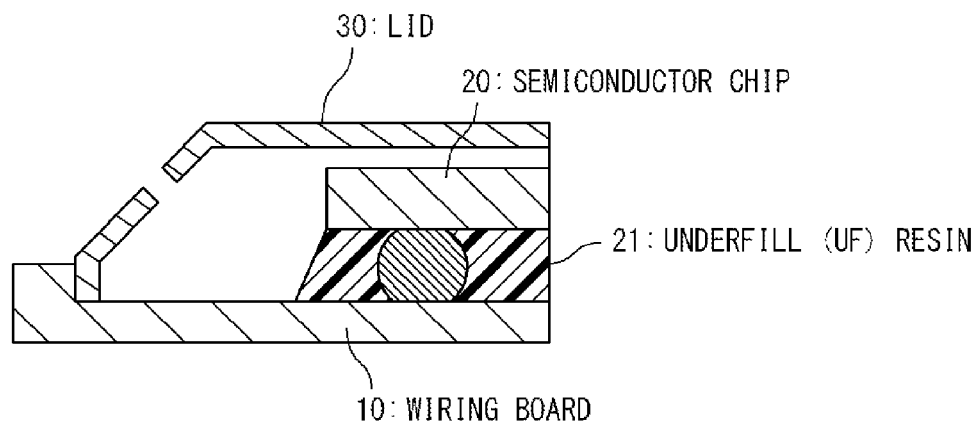
Figure 6D:
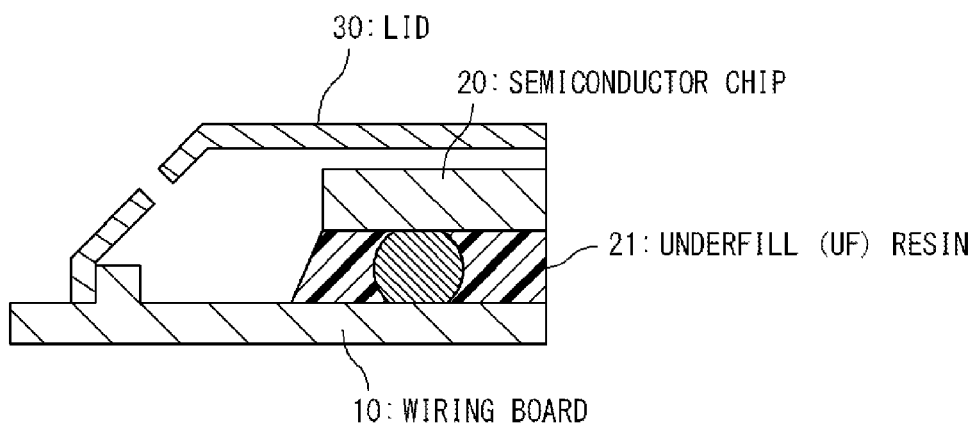

FIGS. 6A to 6D are sectional views showing the first to the fourth examples of methods of fixing the lid according to the embodiment of the present invention. For example, as shown in FIG. 6A, a caving portion for temporally fixing the edge portion of the lid 30 is formed on the wiring board 10, and the lid 30 is fitted into the wiring board 10 at the caving portion. As shown in FIG. 6B, a concave portion is formed on the wiring board 10 and a convex portion is formed on the lid 30 (or reverse of those), and the lid 30 is fitted into the wiring board 10 by the concave and convex portions. As shown in FIG. 6C, a protrusion portion or a step portion is formed on the wiring board 10 outside the edge portion of the lid 30, and the edge portion of the lid 30 is temporally fixed by the protrusion portion or the step portion. As shown in FIG. 6D, a protrusion portion or a step portion is formed on the wiring board 10 inside the edge portion of the lid 30, and the edge portion of the lid 30 is temporally fixed by the protrusion portion or the step portion. Those of the caving portion, the protrusion portion or the step portion may be portions which the wiring board 10 is modified, or may be formed of resin, solder and the like.

Moreover, a method may be considered in which the fixing of the edge portion of the lid 30 is not required, by devising (modifying) the manufacturing process itself. For example, under the condition that the needle dispensers are inserted into the inlet portions 31 formed in the lid 30, the lid 30 is arranged on the wiring board 10, and then, the gap filling resin 40 is injected into the gap portion inside the lid 30 from the inlet portions 31 by the needle dispensers.

Alternatively, it may be acceptable that when the lid 30 is temporally arranged on the wiring board 10 and the needle dispensers are inserted into the inlet portions 31 formed on the lid 30, the positioning and the fixing of the lid 30 is performed by the needle dispensers. In this case, under the condition that the lid 30 is temporally fixed by the needle dispensers, the gap filling resin 40 is injected into the gap portion inside the lid 30 by the inlet portions 31.

After that, the needle dispensers are removed from the inlet portions 31, and then, the gap filling resin 40 is thermally-cured.

In this way, by devising the manufacturing process itself, it is not required that the edge portion of the lid 30 is temporally fixed by the resin or the structure.

Incidentally, in the case that the lid 30 itself has enough weight and/or friction and is not easily movable on the wiring board 10 during the injection of the gap filling resin 40, a device for temporally fixing the lid 30 is not required.

Here, if the inlet portion 31 for injecting resin is not previously formed in the lid 30, it is considered that the step of forming the inlet portions 31 is added after the lid 30 is arranged on the wiring board 10. In this case, it is required to pay attention to the fact that dust and broken pieces generated during the formation of the inlet portions 31 do not adversely affect the wiring board 10 and the semiconductor chip 20 inside the lid 30. As for countermeasures, a method that the inlet portions 31 are provided by melting a part of the lid 30, a method that the inlet portions 31 are provided by hollowing a part of the lid 30 while the dust and the broken pieces of the part are absorbed and collected outside the lid 30. However, the present embodiment is not limited to these methods.

In the present embodiment, after the lid 30 is arranged on the wiring board 10, the gap filling resin 40 is injected into the inside of the lid 30 from the inlet portions 31 formed in the lid 30, and then, the gap filling resin 40 is thermally-cured. By the gap filling resin 40 injected into the inside of the lid 30, the adhesive strength between the wiring board 10 and the lid 30 can be improved. By improving the adhesive strength between the wiring board 10 and the lid 30, the adhesive 23 for bonding the wiring board 10 and the edge portion of the lid 30 is not indispensable, thereby enabling the area of the edge portion of the lid 30 to be reduced. Therefore, the overall size of the semiconductor package can be reduced.

Alternatively, by reducing the area of the edge portion of the lid 30, the size of the area occupying the inside of the lid 30 can be increased. Therefore, even if the package size is equal to the conventional size, the area where the semiconductor chip 20 can be arranged can be increased. According to this, the size of the semiconductor chip 20 can be increased, and/or when a plurality of the semiconductor chip 20 is mounted in the identical package, the number of semiconductor chips 20 to be mounted can be increased.

In addition, by hardening the gap portion inside the lid 30 by the gap filling resin 40, the warpage variation of the wiring board 10 can be reduced during the thermal cycle. Consequently, the reliability of the semiconductor package can be improved after the completion of the semiconductor package.

Moreover, by suppressing the warpage of the wiring board 10, the failure that electric connection through the solder balls 11 is disconnected by applying stress to the solder balls 11 can be suppressed.

Furthermore, by devising an opening position of the inlet portion 31 on the lid 30, air flows inside the lid 30 to generate air convection, thereby improving a thermal radiation performance.

In the present embodiment, even though the semiconductor chip on package is described as the example, the present embodiment can be applied to the package on package. In this case, the semiconductor chip 20 in the present embodiment is replaced by the package. Alternatively, in the present embodiment, the semiconductor chip 20 and the wiring board 10 are replaced by the upper package and the lower package, respectively.

As described above, the present invention is characterized in that, in the semiconductor package such as the FCBGA (Flip Chip Ball Grid Array), by providing the inlet portions in the lid, the resin is injected into the inside of the lid from the inlet portions, thereby enabling the adhesive strength between the lid and the wiring board to be improved. That is, in the present invention, the lid of the FCBGA package is fixed with sufficient strength to the wiring board.

Figure 1:
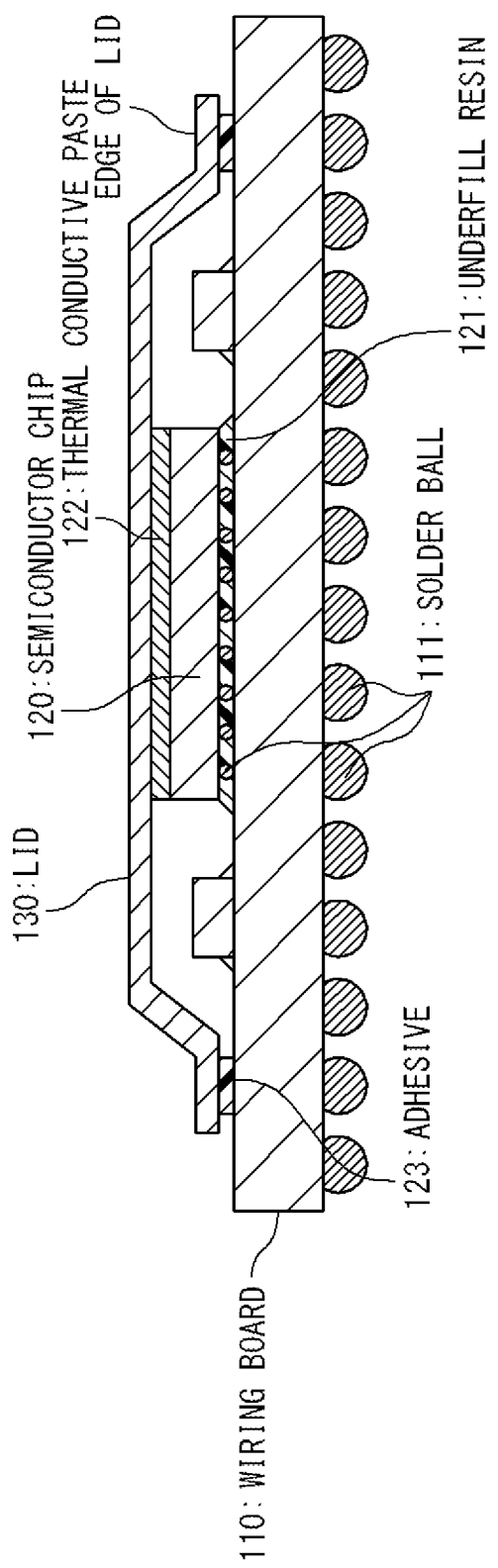
FIG. 1 is a sectional view showing a configuration example of the FCBGA semiconductor package disclosed in the related art.

In the technique regarding the conventional FCBGA semiconductor package, as shown in FIG. 1, it is indispensable or important for the lid to be bond to the wiring board at the edge of the lid. However, in the present invention, it may be not necessary for the lid to be bond to the wiring board at the edge of the lid.

In the present invention, in the semiconductor package, by functioning the inlet portions formed on the lid as the openings, air comes in and goes out from and to the inlet portions, thereby enabling the thermal radiation performance to be improved. Further, by strongly bonding the lid and the wiring board, even if the thermal cycle (temperature variation) occurs, the warpage of the package (especially the wiring board) can be prevented. In addition, the outer gas generated from the adhesive inside the package can be exhausted from the inlet portions.

As mentioned above, with reference to FIG. 2 to FIG. 6D, the configuration example and manufacturing process according to the embodiment of the present invention. In addition to the above description, another configuration example of the semiconductor apparatus according to the embodiment of the present invention will be described below.

Figure 7:
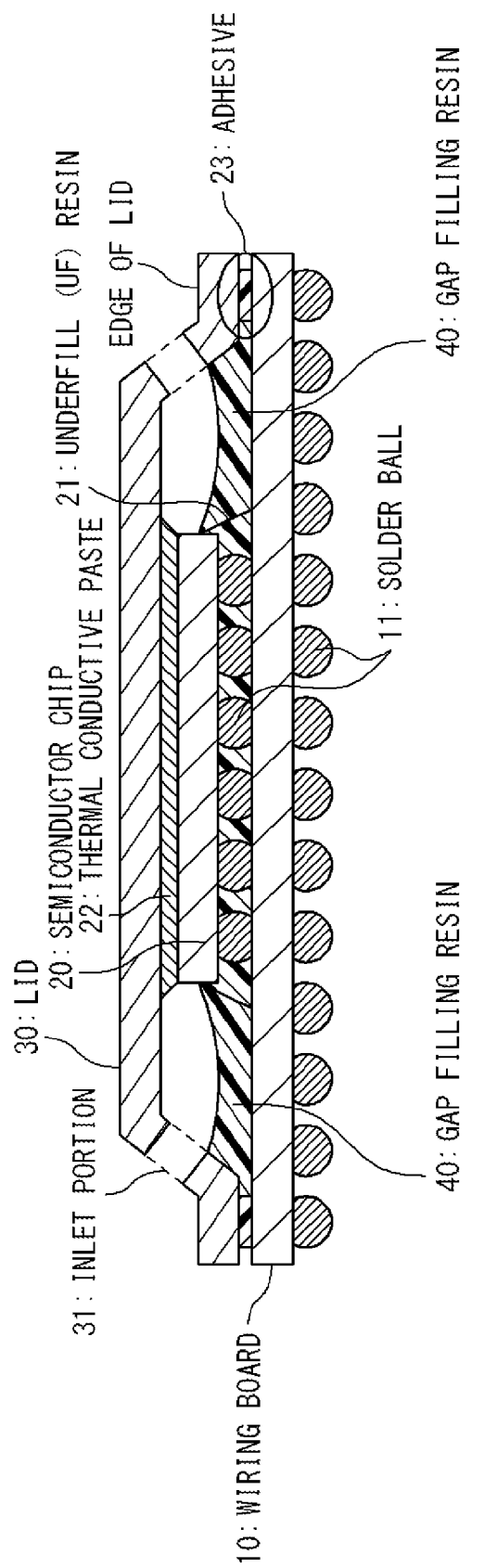
FIG. 7 is a sectional view showing another configuration example of a semiconductor apparatus according to the embodiment of the present invention.

FIG. 7 is a sectional view showing another configuration example of the semiconductor apparatus according to the embodiment of the present invention. The configuration example of FIG. 7 is different from that of FIG. 2 in the existence of the edge of the lid, but is the same as that of FIG. 2 in other points. In the present configuration example, since the edge of the lid exists, it is difficult to miniaturize the package. However, as compared with the conventional technique of FIG. 1, by bonding the lid 30 and the wiring board 10 using not only the adhesive 23 but also the gap filling resin 40, the adhesive area can be increased, thereby enabling the adhesive strength to be improved. By increasing the adhesive area, the warpage of the wiring board 10 can be suppressed by the lid 30. By suppressing the warpage of the wiring board 10, when the BGA (Ball Grid Array) semiconductor package is mounted on the wiring board, the soldering failure (electric connection failure of the solder bumps) can be prevented.

The whole or part of the embodiments disclosed above can be described as, but not limited to, the followings concerning a method of manufacturing a semiconductor apparatus.

A method of manufacturing a semiconductor apparatus, includes: arranging a lid on a wiring board mounting a semiconductor chip, the lid including inlet portions for injecting resin, the semiconductor chip on the wiring board being covered with the lid; inserting a dispenser into each of the inlet portions; injecting gap filling resin into an inside of the lid from the each inlet portion by using the dispenser; and thermally-curing the gap filling resin.

The method of manufacturing a semiconductor apparatus according to the above-mentioned method, further includes: forming at least one of a caving portion, a protrusion portion and a step portion on the wiring board; and temporally fixing the lid on the wiring board when injecting the gap filling resin into the inside of the lid after arranging the lid on the wiring board.

The method of manufacturing a semiconductor apparatus according to the above-mentioned method further includes: temporally fixing the lid on the wiring board by using the dispenser when injecting the gap filling resin into the inside of the lid.

The method of manufacturing a semiconductor apparatus according to the above-mentioned method further includes: injecting the gap filling resin into the inside of the lid between the wiring board and the side wall of the lid, while avoiding the gap filling resin from having contact with the semiconductor chip and underfill resin provided under the semiconductor chip.

The method of manufacturing a semiconductor apparatus according to the above-mentioned method, further includes: forming the inlet portions in the lid after arranging the lid on the wiring board.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:
1. A semiconductor package, comprising:
   a wiring board, a semiconductor chip being mounted on said wiring board;
   a heat sink lid configured to include inlet portions for injecting resin, said semiconductor chip being covered with said lid on said wiring board; and
   gap filling resin configured to bond said wiring board and said lid inside said lid, said gap filling resin having contact with said wiring board and said lid for bonding said wiring board to said lid, and a top surface of said semiconductor chip being free of contact with said gap filling resin.

2. The semiconductor package according to claim 1, wherein said inlet portions are provided on a side wall of said lid.

3. The semiconductor package according to claim 1, wherein said inlet portions are provided on a top wall of said lid.

4. The semiconductor package according to claim 1, wherein said gap filling resin is injected inside said lid to bond said wiring board and said lid such that said gap filling resin has contact with said wiring board, a side wall of said lid, and underfill resin provided under said semiconductor chip.

5. The semiconductor package according to claim 1, wherein said gap filling resin is injected inside said lid to bond said wiring board and said lid such that said gap filling resin has contact with said wiring board and a side wall of said lid, and does not have contact with said semiconductor chip nor underfill resin provided under said semiconductor chip.

6. The semiconductor package according to claim 1, wherein said lid is fitted into said wiring board at one of a caving portion, a protrusion portion and a step portion on said wiring board.

7. The semiconductor package according to claim 2, wherein said inlet portions are thin and long openings along said side wall of said lid.

8. The semiconductor package according to claim 2, wherein said inlet portions are small openings arranged at regular intervals along said side wall of said lid.

9. The semiconductor package according to claim 1, wherein said gap filling resin fills an inside of said lid.

10. A semiconductor package, comprising:
a wiring board;
a semiconductor chip mounted on said wiring board;
a heat sink lid having inlet portions that penetrate through a thickness of said lid for receiving material to be injected through from an exterior of said lid to an interior of said lid,
an outer perimeter portion of said lid being mounted to said wiring board so that said lid encloses said semiconductor chip inside the interior of said lid with a gap between an upper surface of the semiconductor chip and a lower surface of the lid opposite the upper surface of the semiconductor chip;
a first material provided in the gap between the upper surface of the semiconductor chip and the lower surface of the lid, the first material suitable for transmitting heat from the semiconductor chip to the lid; and
a second material provided at a periphery of the interior of said lid, the second material suitable for bonding the outer perimeter portion of said lid to said wiring board.

11. The semiconductor package according to claim 10, wherein said second material is a gap filling resin in contact with said wiring board and said lid for bonding said lid to said wiring board.

12. The semiconductor package according to claim 10, wherein said second material is injected inside said lid to bond said wiring board and said lid such that said second material has contact with said wiring board, a side wall of said lid along the periphery of the interior of said lid, and underfill resin provided under said semiconductor chip.

13. The semiconductor package according to claim 10, wherein said second material is injected inside said lid to bond said wiring board and said lid such that said second material has contact with said wiring board and a side wall of said lid along the periphery of the interior of said lid, and does not have contact with said semiconductor chip.

14. The semiconductor package according to claim 13, further comprising:
an underfill resin provided underneath said semiconductor chip,
wherein said second material is not in contact with said underfill resin provided underneath said semiconductor chip.

15. The semiconductor package according to claim 10, wherein the lower surface of said lid is a planar surface parallel to the upper surface of the semiconductor chip.

16. A semiconductor package, comprising:
a wiring board;
a semiconductor chip mounted on said wiring board;
a heat sink lid comprising a planar portion and an edge portion extending from a periphery of the planar portion to form an interior of said lid, the edge portion mounted on the wiring board such that the semiconductor chip is enclosed within the interior of said lid,
the lid having at least one opening that penetrates through a thickness of the lid for receiving material to be injected through from an exterior of the lid to the interior of said lid; and
bonding material provided on a periphery of the interior of said lid for bonding an interior portion of the edge portion to the wiring board,
wherein said bonding material is injected inside said lid to bond said wiring board and said lid such that said bonding material has contact with said wiring board and a side wall of said lid along the periphery of the interior of said lid, and does not have contact with said semiconductor chip.

17. The semiconductor package according to claim 16, wherein a gap is formed between an upper surface of the semiconductor chip and a lower surface of the lid opposite the upper surface of the semiconductor chip, a thermal conductive material provided inside the gap for transmitting heat from the semiconductor chip to the lid.

18. The semiconductor package according to claim 16, wherein said bonding material also has contact with underfill resin provided under said semiconductor chip.

19. The semiconductor package according to claim 16, further comprising:
an underfill resin provided underneath said semiconductor chip,
wherein said bonding material is not in contact with said underfill resin provided underneath said semiconductor chip.

* * * * *